(12) United States Patent
Zhao et al.

(10) Patent No.: US 12,727,407 B2
(45) Date of Patent: Sep. 1, 2026

(54) RF PULSING ASSISTED TUNGSTEN-CONTAINING FILM DEPOSITION

(71) Applicant: Applied Materials, Inc., Santa Clara, CA (US)

(72) Inventors: Qinghua Zhao, Milpitas, CA (US); Guoqing Li, Santa Clara, CA (US); Rui Cheng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 621 days.

(21) Appl. No.: 18/128,049

(22) Filed: Mar. 29, 2023

(65) Prior Publication Data

US 2024/0332003 A1 Oct. 3, 2024

(51) Int. Cl.
*H10P 14/692* (2026.01)
*C23C 16/14* (2006.01)
*H01J 37/32* (2006.01)

(52) U.S. Cl.
CPC .......... *H10P 14/6939* (2026.01); *C23C 16/14* (2013.01); *H01J 37/32146* (2013.01); *H01J 37/32155* (2013.01); *H01J 2237/332* (2013.01)

(58) Field of Classification Search
CPC ...... H01L 21/28556-28562; C23C 16/50-517
See application file for complete search history.

(56) References Cited

U.S. PATENT DOCUMENTS

2003/0198587 A1* 10/2003 Kaloyeros ............. C01B 21/062 427/255.394
2011/0303960 A1* 12/2011 Cao ...................... C23C 14/165 257/E21.294
2014/0057454 A1 2/2014 Subramonium et al.
2018/0254195 A1 9/2018 Fung et al.
(Continued)

FOREIGN PATENT DOCUMENTS

KR 20010042649 A 5/2001
KR 20130111518 A 10/2013
KR 20210116689 A 9/2021

OTHER PUBLICATIONS

International Search Report and Written Opinion for PCT/US2024/020481 mailed Jul. 8, 2024, 7 pages.
(Continued)

*Primary Examiner* — Christine S. Kim
*Assistant Examiner* — Cole Leon Lindsey
(74) *Attorney, Agent, or Firm* — Kilpatrick Townsend & Stockton LLP

(57) ABSTRACT

Exemplary semiconductor processing methods may include providing one or more deposition precursors to a processing region of a semiconductor processing chamber, the deposition precursors may be or include a tungsten-containing precursor. A substrate may be disposed within the processing region of the semiconductor processing chamber. The methods may include forming a plasma of the one or more deposition precursors in the processing region. The plasma may be at least partially formed by an RF power operating
(Continued)

at less than or about 3,000 W and at a pulsing frequency less than or about 100,000 Hz. The methods may include forming a layer of material on the substrate. The layer of material may be or include a tungsten-containing material.

20 Claims, 3 Drawing Sheets

(56) References Cited

U.S. PATENT DOCUMENTS

| | | | | |
|---|---|---|---|---|
| 2020/0258720 | A1 * | 8/2020 | Nittala .............. | H01J 37/32082 |
| 2021/0143010 | A1 | 5/2021 | Min et al. | |
| 2022/0319841 | A1 | 10/2022 | Wang et al. | |
| 2022/0341034 | A1 | 10/2022 | Aydin et al. | |

OTHER PUBLICATIONS

International Application No. PCT/US2024/020481, International Preliminary Report on Patentability mailed on Oct. 9, 2025, 6 pages.
Korean Application No. 10-2025-7033899, Office Action mailed on Jun. 12, 2026, 16 pages (8 pages of original document and 8 pages of English Translation).
Rakic et al., Optical Properties of Metallic Films for Vertical-Cavity Optoelectronic Devices, Applied Optics, vol. 37, No. 22, Aug. 1, 1998, pp. 5271-5283.

* cited by examiner

RF PULSING ASSISTED TUNGSTEN-CONTAINING FILM DEPOSITION

TECHNICAL FIELD

The present technology relates to deposition processes and chambers. More specifically, the present technology relates to methods of producing tungsten-containing films utilizing RF pulsing during deposition.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Exemplary semiconductor processing methods may include providing one or more deposition precursors to a processing region of a semiconductor processing chamber, the deposition precursors may be or include a tungsten-containing precursor. A substrate may be disposed within the processing region of the semiconductor processing chamber. The methods may include forming a plasma of the one or more deposition precursors in the processing region. The plasma may be at least partially formed by an RF power operating at less than or about 3,000 W and at a pulsing frequency less than or about 100,000 Hz. The methods may include forming a layer of material on the substrate. The layer of material may be or include a tungsten-containing material.

In some embodiments, the tungsten-containing precursor may be or include tungsten hexafluoride ($WF_6$). A temperature within the semiconductor processing chamber may be maintained at less than or about 800° C. while forming the layer of material on the substrate. A pressure within the semiconductor processing chamber may be maintained at less than or about 75 Torr while forming the layer of material on the substrate. The one or more deposition precursors may further include a carbon-containing precursor. The layer of material may be a tungsten-and-carbon-containing material. The carbon-containing precursor may be or include a hydrocarbon. The carbon-containing precursor may be or include propene ($C_3H_6$). The plasma may be at least partially formed by an RF power operating at a duty cycle between about 10% and 90%. The layer of material may be characterized by an extinction coefficient of greater than or about 2.5 at 633 nm. The layer of material may be characterized by an average surface roughness (Ra) of less than or about 0.7 nm. The layer of material may be characterized by a tungsten content of greater than or about 30 at. %. The layer of material may be characterized by a stress of greater than or about 200 MPa.

Some embodiments of the present technology may encompass semiconductor processing methods. The methods may include providing a tungsten-containing precursor and a carbon-containing precursor to a processing region of a semiconductor processing chamber. A substrate may be disposed within the processing region of the semiconductor processing chamber. The methods may include forming a plasma of the tungsten-containing precursor and the carbon-containing precursor in the processing region. The plasma may be at least partially formed by an RF power operating at between about 500 W and about 2,000 W, at a pulsing frequency less than or about 10,000 Hz, and at a duty cycle between about 10% and 90%. The methods may include forming a layer of material on the substrate. The layer of material may be or include a tungsten-containing material. The layer of material may be characterized by a tungsten content of greater than or about 30 at. %. The layer of material may be characterized by an average surface roughness (Ra) of less than or about 0.7 nm.

In some embodiments, the tungsten-containing precursor may be or include tungsten hexafluoride ($WF_6$). The carbon-containing precursor may be or include propene ($C_3H_6$). A temperature within the semiconductor processing chamber may be maintained at less than or about 700° C. while forming the layer of material on the substrate. A pressure within the semiconductor processing chamber may be maintained at less than or about 60 Torr while forming the layer of material on the substrate. The methods may include providing a boron-containing precursor to the processing region of the semiconductor processing chamber with the tungsten-containing precursor and the carbon-containing precursor. The layer of material may be characterized by a stress of greater than or about 250 MPa.

Some embodiments of the present technology may encompass semiconductor processing methods. The methods may include providing a tungsten-containing precursor and a carbon-containing precursor to a processing region of a semiconductor processing chamber. A substrate may be disposed within the processing region of the semiconductor processing chamber. The methods may include forming a plasma of the tungsten-containing precursor and the carbon-containing precursor in the processing region. The plasma may be at least partially formed by an RF power operating at a pulsing frequency less than or about 10,000 Hz, and at a duty cycle between about 10% and 90%. The methods may include forming a layer of material on the substrate, wherein the layer of material comprises a tungsten-containing material. The layer of material may be characterized by a tungsten content of greater than or about 30 at. %. The layer of material may be characterized by an average surface roughness (Ra) of less than or about 0.7 nm. The layer of material may be characterized by an extinction coefficient of greater than or about 2.5 at 633 nm.

In some embodiments, the plasma is at least partially formed by an RF power operating at greater than or about 500 W and at a pulsing frequency greater than or about 1,000 Hz and less than or about 8,000 Hz. The methods may include providing a boron-containing precursor to the processing region of the semiconductor processing chamber with the tungsten-containing precursor and the carbon-containing precursor.

Such technology may provide numerous benefits over conventional systems and techniques. For example, pulsing RF power may improve deposition characteristics. More specifically, pulsing RF power during deposition operations may result in an increased ion density in the plasma, that may result in desirable mechanical characteristics in the material. The mechanical characteristics may include increased stress and increased extinction coefficient while maintaining an average surface roughness (Ra). These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
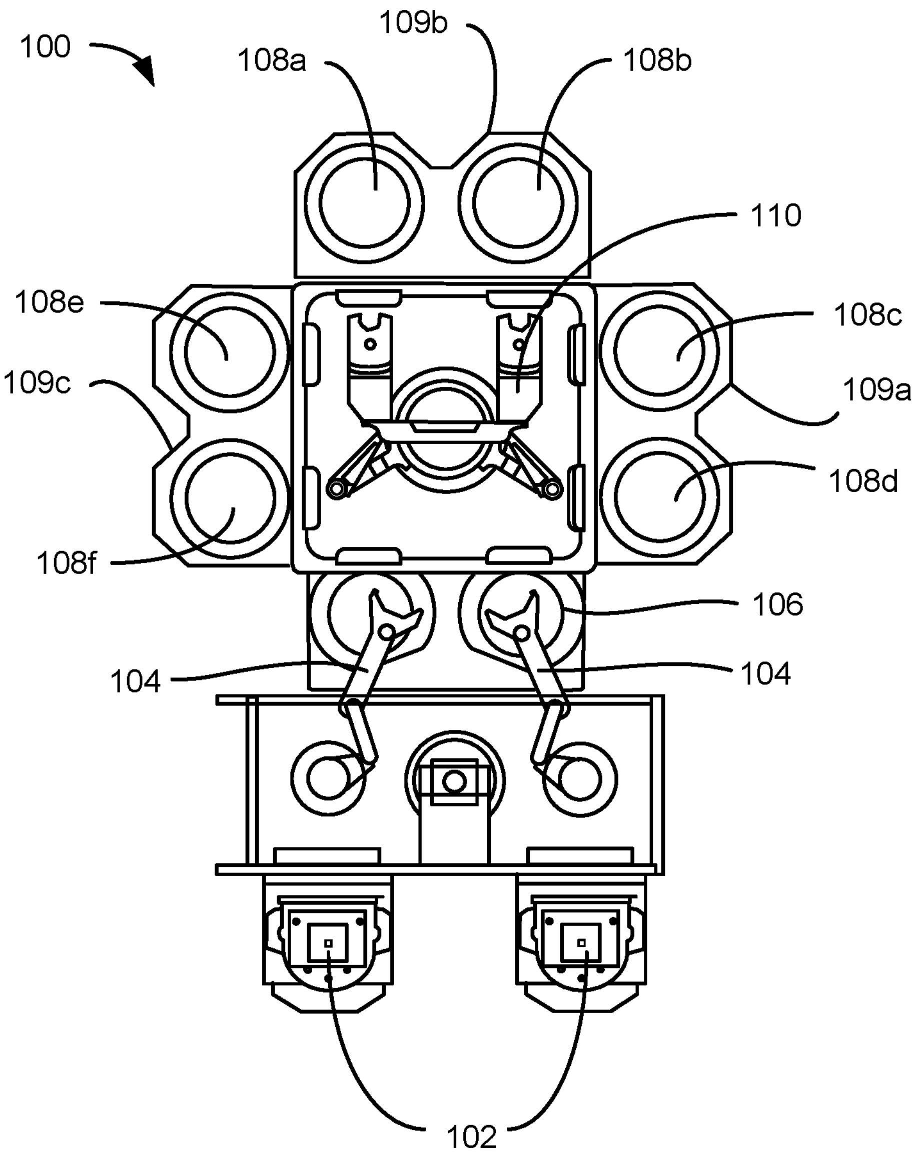
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials, such as hardmask films. Conventional hardmask films may be deposited by continuously applying RF power. However, this process may result in a film with undesirable mechanical characteristics.

The present technology may overcome these issues by performing a deposition process while pulsing the RF power during the deposition of the film. Much plasma processing in which hardmask film is being deposited is performed at continuous RF power at lower plasma powers, which produces an ion density that may affect material characteristics of the material being deposited. In the present embodiments, the RF power is pulsed during deposition at higher plasma power than conventional methods to increase the ion density of the plasma. By increasing the ion density of the plasma, the material deposited may be a denser material than the material deposited during continuous RF power. This may advantageously increase desired mechanical characteristics of the material, while simultaneously substantially maintaining the roughness properties of the film. The produced films may be characterized by higher tensile strength and extinction coefficient over conventional technologies, and may also allow increased metal content in the deposited films.

Although the remaining disclosure will routinely identify specific deposition processes utilizing the disclosed technology, it will be readily understood that the systems and methods are equally applicable to other deposition chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric, hardmask, or other film on the substrate. In one configuration, two pairs of the processing chambers, e.g., 108*c-d* and 108*e-f*, may be used to deposit dielectric or hardmask material on the substrate, and the third pair of processing chambers, e.g., 108*a-b*, may be used to etch the deposited dielectric or pattern the hardmask. In another configuration, all three pairs of chambers, e.g., 108*a-f*, may be configured to deposit stacks of alternating dielectric or hardmask films on the substrate. Any one or more of the processes described may be carried out in chambers separated from the fabrication system shown in different embodiments. It will be appreciated that additional configurations of deposition, etching, annealing, and curing chambers for dielectric or hardmask films are contemplated by system 100.

Figure 2:
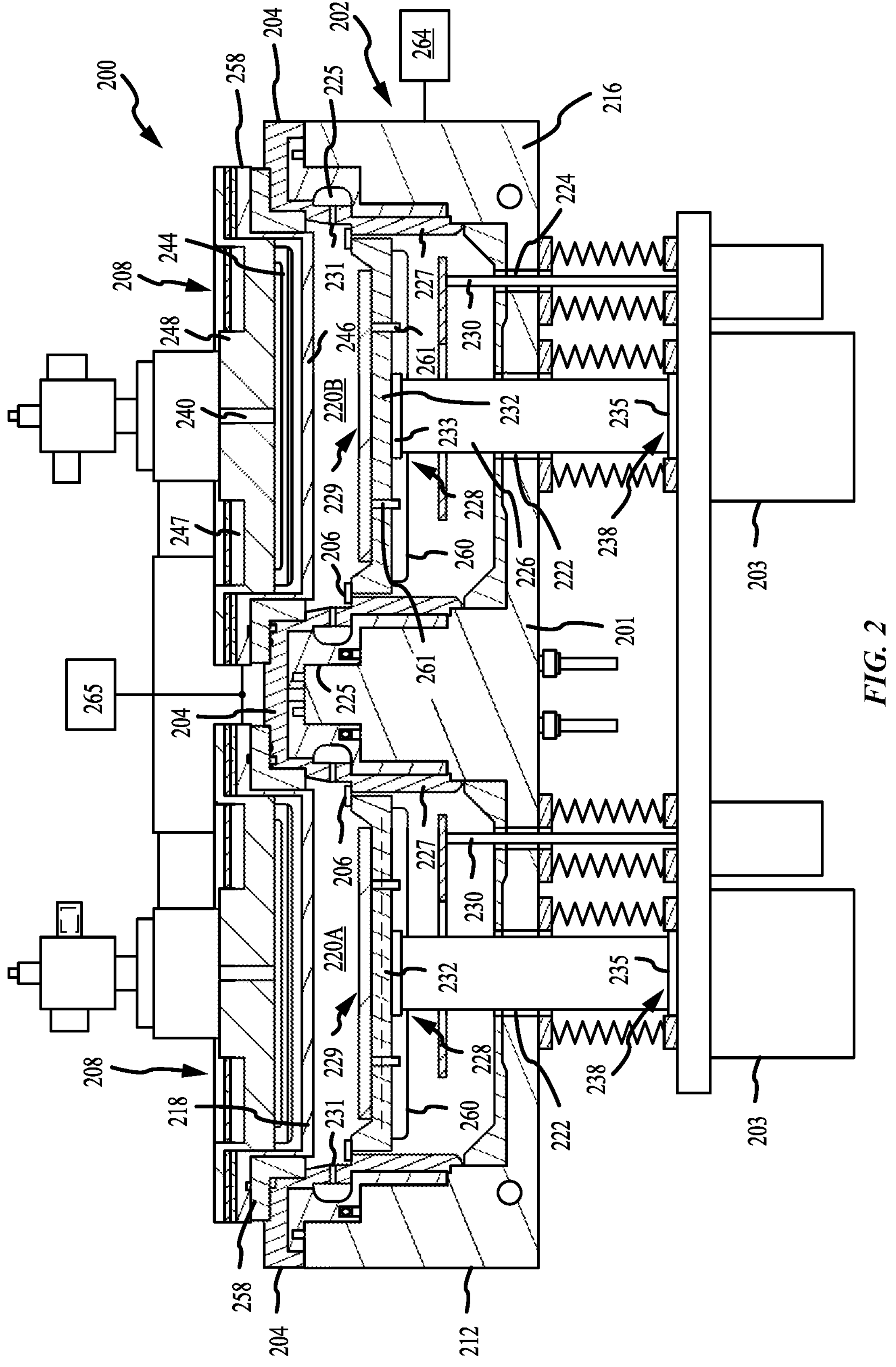
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
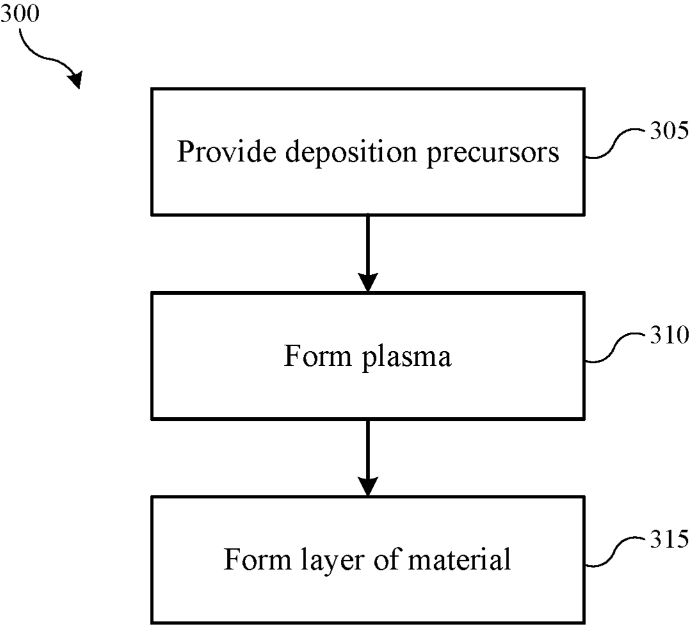
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include a processing method that may include operations for forming a layer of material, such as a film, or other deposition operations while pulsing RF power, which may result in desired mechanical characteristics, and as may be explained further below. The method may include optional operations prior to initiation of method 300, or the method may include additional operations. For example, method 300 may include operations performed prior to the start of the method, including additional deposition, removal, or treatment operations. In some embodiments, method 300 may include flowing one or more deposition precursors into a processing chamber at operation 305, which may deliver the precursor or precursors into a processing region of the chamber where a substrate may be housed, such as region 220, for example.

In some embodiments, the one or more deposition precursors may be or include a tungsten-containing precursor for producing a tungsten-containing material, such as tungsten carbide or tungsten boron carbide. In tungsten carbide or tungsten boron carbide depositions, the one or more deposition precursors may also include a carbon-containing precursor and/or a boron-containing precursor. The deposition precursors may or may not include delivery of additional precursors, such as carrier gases. In some embodiments, the deposition may utilize a single deposition precursor that includes tungsten and carbon and/or boron. Although a carrier gas, such as an inert precursor, may be delivered with the deposition precursor, additional precursors intended to react with the one or more deposition precursors and produce deposition products may not be used. By limiting the deposition to a single precursor, more simplified deposition chambers may be used, as uniform mixing and delivery of multiple precursors may not be required.

Tungsten-containing precursors according to some embodiments of the present technology may include precursors having tungsten, and may include linear branched precursors, cyclic precursors, or any number of additional precursors. Although any number of tungsten-containing precursors may be utilized, in some embodiments of the present technology, exemplary tungsten-containing precursors may be or include tungsten hexafluoride ($WF_6$) or tungsten hexachloride ($WCl_6$). A flow rate of the tungsten-containing precursor may be less than or about 1,000 sccm, such as less than or about 900 sccm, less than or about 800 sccm, less than or about 700 sccm, less than or about 600 sccm, less than or about 500 sccm, less than or about 400 sccm, less than or about 300 sccm, less than or about 200 sccm, less than or about 100 sccm, less than or about 75 sccm, less than or about 50 sccm, less than or about 25 sccm, less than or about 10 sccm, or less.

Carbon-containing precursors according to some embodiments of the present technology may include precursors having carbon, and may include linear branched precursors, cyclic precursors, or any number of additional precursors. Although any number of carbon-containing precursors may be utilized, in some embodiments of the present technology, exemplary carbon-containing precursors may be or include hydrocarbons, such as alkenes. For example, the carbon-containing precursor may be or include propene ($C_3H_6$) or butene ($C_4H_8$). A flow rate of the carbon-containing precursor, if present, may be less than or about 1,000 sccm, such as less than or about 900 sccm, less than or about 800 sccm, less than or about 700 sccm, less than or about 600 sccm, less than or about 500 sccm, less than or about 400 sccm, less than or about 300 sccm, less than or about 200 sccm, less than or about 100 sccm, less than or about 75 sccm, less than or about 50 sccm, less than or about 25 sccm, less than or about 10 sccm, or less.

Boron-containing precursors according to some embodiments of the present technology may include precursors having boron, and may include linear branched precursors, cyclic precursors, or any number of additional precursors. Although any number of boron-containing precursors may be utilized, in some embodiments of the present technology, exemplary boron-containing precursors may be or include borane ($BH_3$), diborane ($B_2H_6$), boron trifluoride ($BF_3$), or boron trichloride ($BCl_3$). A flow rate of the boron-containing precursor, if present, may be less than or about 5,000 sccm, such as less than or about 4,000 sccm, less than or about 3,000 sccm, less than or about 2,000 sccm, less than or about 1,000 sccm, less than or about 750 sccm, less than or about 500 sccm, less than or about 400 sccm, less than or about 300 sccm, less than or about 200 sccm, less than or about 100 sccm, less than or about 75 sccm, less than or about 50 sccm, less than or about 25 sccm, less than or about 10 sccm, or less.

At operation 310, a plasma may be generated of the precursors within the processing region, such as by providing RF power to the faceplate to generate a plasma within processing region 220, although any other processing chamber capable of producing plasma may similarly be used. The plasma may be formed by pulsing RF power, instead of using continuous RF power. The RF power may cycle between cycles of being "on" and "off" repeatedly. During "on" cycles, the RF operating power may be less than or about 3,000 W. A pulsing frequency may be less than or about 100,000 Hz. A duty cycle may be between about 5% and 95%. Pulsing the RF power may increase the ion density while maintaining the average ion energy, as compared to continuous RF power. In conventional continuous RF power processes, the ion density may be about $1\times10^{16}$ ions per cubic meter, whereas embodiments of the present disclosure may feature an ion density greater than this amount, such as greater than or about $1\times10^{18}$ or $1\times10^{19}$ ions per cubic meter. By forming the plasma by pulsing RF power, tungsten content in the film may be increased while maintaining or even reducing the average surface roughness the film, which may contribute to increased stress of the film without increasing the extinction coefficient of the film.

In conventional deposition processes, the continuous RF power may be at less than 500 W, for example. In embodiments of the present disclosure, the RF power may be at a higher level during "on" cycles. In conventional deposition processes of tungsten-containing films, higher plasma RF power may adversely affect mechanical properties of the layer of material. For example, higher plasma RF power on a continuous basis may increase an average surface roughness of the material, decrease an upper bound of stress, increase the extinction coefficient of the film, or require less tungsten incorporation to maintain mechanical properties. However, the present disclosure has discovered that by cycling with increased plasma power, ion density may be increased compared to continuous RF power while maintaining a similar ion energy as continuous RF power. In embodiments, the RF power may be greater than or about 500 W, such as greater than or about 600 W, greater than or about 700 W, greater than or about 800 W, greater than or about 850 W, greater than or about 900 W, greater than or about 950 W, greater than or about 1,000 W, greater than or about 1,250 W, greater than or about 1,500 W, greater than or about 1,750 W, greater than or about 2,000 W, greater than or about 2,250 W, greater than or about 2,500 W, greater than or about 2,750 W, or higher. Additionally, the RF power may be less than or about 3,000 W as previously discussed, and may be less than or about 2,750 W, less than or about 2,500 W, less than or about 2,250 W, less than or about 2,000 W, less than or about 1,750 W, less than or about 1,500 W, or less.

By increasing the pulsing frequency, the mechanical properties of the material may be tuned. Higher pulsing frequencies may increase the stress at a greater rate than lower pulsing frequencies. However, lower pulsing frequencies may increase other characteristics, such as extinction coefficient and tungsten content, at a greater rate than higher pulsing frequencies. In embodiments of the present disclosure, the pulsing frequency may be less than or about 12,500 Hz, less than or about 10,000 Hz, less than or about 9,000 Hz, less than or about 8,000 Hz, less than or about 7,000 Hz, less than or about 6,000 Hz, less than or about 5,000 Hz, less than or about 4,000 Hz, less than or about 3,000 Hz, less than or about 2,000 Hz, less than or about 1,000 Hz, or lower. Frequencies between around 1,000 Hz and around 8,000 Hz have been observed to increase mechanical properties of the material at the greatest rate, but frequencies less than 1,0000 Hz or greater than 8,000 Hz still provide increased properties compared to continuous RF power.

With lower duty cycles, the stress may increase, but the extinction coefficient may also increase. Additionally, with lower duty cycles, the tungsten content may decrease. If the duty cycle is less than 5%, the stress may not increase as much. Conversely, with higher duty cycles, the extinction coefficient may also increase, but the stress may not increase. Additionally, with higher duty cycles, the tungsten content may increase. By maintaining a duty cycle between about 5% and about 95%, a material may be produced, which is characterized by both an increased stress and a decreased extinction coefficient. For example, the duty cycle may be greater than or about 10%, greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, or greater than or about 65%. Similarly, the duty cycle may be less than or about 90%, less than or about 85%, less than or about 80%, less than or about 75%, less than or about 70%, less than or about 65%, less than or about 60%, less than or about 55%, less than or about 50%, less than or about 45%, less than or about 40%, or less than or about 35%.

The deposition may be performed at substrate or pedestal temperatures less than or about 800° C., which may be due to thermal budget issues at back end of line operations. Consequently, in some embodiments the deposition may occur at temperatures less than or about 750° C., less than or about 700° C., less than or about 650° C., less than or about 600° C., less than or about 550° C., less than or about 500° C., less than or about 450° C., less than or about 400° C., less than or about 350° C., less than or about 300° C., less than or about 250° C., less than or about 200° C., or lower. Additionally, the deposition may be performed at a pressure of less than or about 75 Torr, such as less than or about 65 Torr, less than or about 60 Torr, less than or about 55 Torr, less than or about 50 Torr, less than or about 40 Torr, less than or bout 30 Torr, less than or about 20 Torr, less than or about 15 Torr, less than or about 10 Torr, less than or about 7 Torr, less than or about 5 Torr, less than or about 2 Torr, or lower.

Material formed in the plasma may be deposited on the substrate at operation 315, which may produce a layer of material on the substrate. The layer of material may include tungsten-containing material, such as a tungsten-and-carbon-containing material. The tungsten-and-carbon-containing material may be or include tungsten carbide or tungsten boron carbide. By pulsing the RF power, ion density in the plasma may be increased, which may increase mechanical properties in the layer of the material to be deposited on the substrate. An increased ion density during RF pulsing may densify the film and, therefore, strengthen the film, as compared to conventional methods using continuous RF power. Further, by maintaining the average ion energy, this may allow the amount of tungsten in the film to be increased and/or the stress to be increased without increasing the average surface roughness and/or extinction coefficient of the film.

As explained above, conventional technologies operating at continuous plasma power may cause the ion density to be lower than if the plasma power were pulsed, which may result in the stress of the material being lower than desired. By pulsing the RF power according to the present technology, tungsten-containing materials may be produced with high tensile stress. Unlike low stress materials that may characterized by internal stress levels that are closer to neutral stress (i.e., 0 MPa), high stress materials are characterized by internal stress levels that are significantly greater than 0 MPa (i.e., high positive (tensile) stress) or significantly less than 0 MPa (i.e., high negative (compressive) stress). For example, the film may be characterized by a stress of greater than or about 200 MPa, and may be greater than or about 225 MPa, greater than or about 250 MPa, greater than or about 275 MPa, greater than or about 300 MPa, greater than or about 325 MPa, greater than or about 350 MPa, greater than or about 375 MPa, greater than or about 400 MPa, greater than or about 425 MPa, greater than or about 450 MPa, greater than or about 475 MPa, greater than or about 500 MPa, greater than or about 525 MPa, greater than or about 550 MPa, greater than or about 575 MPa, greater than or about 600 MPa, or higher.

Stress may be related to material characteristics of the film, where the higher the stress, the higher the average surface roughness (Ra) of the film. However, by producing films according to embodiments of the present technology, stress may be increased without further increasing the average surface roughness (Ra) of the film that would otherwise occur with conventional technologies. In embodiments, the layer of material may be characterized by an average surface roughness (Ra) of less than or about 0.7 nm, such as less than or about 0.65 nm, less than or about 0.6 nm, less than or about 0.58 nm, less than or about 0.56 nm, less than or about 0.54 nm, less than or about 0.52 nm, less than or about 0.5 nm, less than or about 0.48 nm, less than or about 0.46 nm, less than or about 0.44 nm, less than or about 0.42 nm, less than or about 0.4 nm, or less.

Additionally, by producing films according to some embodiments of the present technology, Young's modulus may be maintained higher than would otherwise occur were conventional technologies capable of producing films with corresponding mechanical properties. For example, in some embodiments, the present technology may produce materials characterized by a Young's modulus of greater than or about 5.0 Gpa, and may be characterized by a Young's modulus of greater than or about 7.5 Gpa, greater than or about 10.0 Gpa, greater than or about 12.5 Gpa, greater than or about 15.0 Gpa, greater than or about 17.5 Gpa, greater than or about 20.0 Gpa, greater than or about 22.5 Gpa, greater than or about 25.0 Gpa, greater than or about 27.5 Gpa, greater than or about 28.0 Gpa, greater than or about 28.5 Gpa, greater than or about 29.0 Gpa, greater than or about 29.5 Gpa, greater than or about 30.0 Gpa, or higher. Consequently, the present technology may produce films characterized by increased stress and reduced average surface roughness (Ra), while maintaining higher Young's modulus of the materials.

The film may characterized by an extinction coefficient of greater than or about 2.5 at 633 nm. Extinction coefficient of the deposited film may be related to deposition temperature, with lower temperatures affording an increased extinction coefficient. This high extinction coefficient may make the film suitable for tungsten-doped hardmask applications. In embodiments, the film may characterized by an extinction coefficient of greater than or about 2.55 at 633 nm, such as greater than or about 2.6 greater than or about 2.65, greater than or about 2.7, greater than or about 2.75, greater than or about 2.8, greater than or about 2.85, greater than or about 2.9, greater than or about 2.95, greater than or about 3.0, greater than or about 3.05, greater than or about 3.1, or higher. Unlike conventional techniques using continuous RF power, the pulsing of the present technology may break the tradeoff between extinction coefficient and average surface roughness (Ra). Accordingly, the increased extinction coefficient values may not result in increased average surface roughness (Ra) values. In fact, as extinction coefficient increases, average surface roughness (Ra) may actually decrease.

In conventional techniques, increased tungsten content in the film may result in increased average surface roughness (Ra) of the film. However, by producing according to embodiments of the present technology, increased amounts of tungsten may be incorporated in the film without increasing average surface roughness (Ra) of the film. The present technology may allow for a tungsten content of greater than or about 30 at. % in the film, such as greater than or about 31 at. %, greater than or about 32 at. %, greater than or about 33 at. %, greater than or about 34 at. %, greater than or about 35 at. %, greater than or about 36 at. %, greater than or about 37 at. %, greater than or about 38 at. %, or higher. Increased tungsten content may make the film better suited for tungsten-doped hardmask applications.

With conventional technologies, the deposition of a tungsten-containing material may result in adhesion issues. For example, in thin film deposition, such as for logic applications, an extensive pre-treatment operation may be necessary to allow for sufficient adhesion of the tungsten-containing material with the underlying material(s). The present application, and the use of pulsing RF power, may provide sufficient adhesion without the use of an extensive pre-treatment operation. Accordingly, the present technology may increase throughput in thin film deposition. Additionally, in thick film deposition, such as for memory applications, a long tungsten ramp up operation may be necessary to allow for sufficient adhesion of the tungsten-containing material with the underlying material(s). This extensive ramp up operation may result in a thick initiation layer with a different composition from the bulk material. The present application, and the use of pulsing RF power, may provide sufficient adhesion that results in a much thinner initiation layer with a similar composition to the bulk material. Accordingly, embodiments of the present technology may increase throughput and avoid integration issues that may be associated with conventional techniques.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a tungsten-containing precursor" includes a plurality of such tungsten-containing precursors, and reference to "the layer of material" includes reference to one or more layers of material and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

providing one or more deposition precursors to a processing region of a semiconductor processing chamber, wherein the deposition precursors comprise a tungsten-containing precursor, and wherein a substrate is disposed within the processing region of the semiconductor processing chamber;

forming a plasma of the one or more deposition precursors in the processing region, wherein the plasma is at least partially formed by an RF power operating at less than or equal to 3,000 W and at a pulsing frequency less than or equal to 100,000 Hz; and forming a layer of material on the substrate, wherein the layer of material comprises a tungsten-containing material, wherein the layer of material is characterized by an extinction coefficient of greater than or equal to 2.5 at 633 nm.

2. The semiconductor processing method of claim 1, wherein the tungsten-containing precursor comprises tungsten hexafluoride ($WF_6$).

3. The semiconductor processing method of claim 1, wherein a temperature within the semiconductor processing chamber is maintained at less than or equal to 800° C. while forming the layer of material on the substrate.

4. The semiconductor processing method of claim 1, wherein a pressure within the semiconductor processing chamber is maintained at less than or equal to 75 Torr while forming the layer of material on the substrate.

5. The semiconductor processing method of claim 1, wherein:

the one or more deposition precursors further comprises a carbon-containing precursor; and the layer of material comprises a tungsten-and-carbon-containing material.

6. The semiconductor processing method of claim 5, wherein the carbon-containing precursor comprises a hydrocarbon.

7. The semiconductor processing method of claim 5, wherein the carbon-containing precursor comprises propene ($C_3H_6$).

8. The semiconductor processing method of claim 1, wherein the plasma is at least partially formed by an RF power operating at a duty cycle between 10% and 90%.

9. The semiconductor processing method of claim 1, wherein the layer of material is characterized by an extinction coefficient of greater than or equal to 3.0 at 633 nm.

10. The semiconductor processing method of claim 1, wherein the layer of material is characterized by an average surface roughness (Ra) of less than or equal to 0.7 nm.

11. The semiconductor processing method of claim 1, wherein the layer of material is characterized by a tungsten content of greater than or equal to 30 at. %.

12. The semiconductor processing method of claim 1, wherein the layer of material is characterized by a stress of greater than or equal to 200 MPa.

13. A semiconductor processing method comprising:

providing a tungsten-containing precursor and a carbon-containing precursor to a processing region of a semiconductor processing chamber, wherein a substrate is disposed within the processing region of the semiconductor processing chamber;

forming a plasma of the tungsten-containing precursor and the carbon-containing precursor in the processing region, wherein the plasma is at least partially formed by an RF power operating at between 500 W and 2,000 W, at a pulsing frequency less than or equal to 10,000 Hz, and at a duty cycle between 10% and 90%; and forming a layer of material on the substrate, wherein the layer of material comprises a tungsten-containing material, wherein the layer of material is characterized by a tungsten content of greater than or equal to 30 at. %, and wherein the layer of material is characterized by an average surface roughness (Ra) of less than or equal to 0.7 nm.

14. The semiconductor processing method of claim 13, wherein:

the tungsten-containing precursor comprises tungsten hexafluoride ($WF_6$); and the carbon-containing precursor comprises propene ($C_3H_6$).

15. The semiconductor processing method of claim 13, wherein:

a temperature within the semiconductor processing chamber is maintained at less than or equal to 700° C. while forming the layer of material on the substrate; and a pressure within the semiconductor processing chamber is maintained at less than or equal to 60 Torr while forming the layer of material on the substrate.

16. The semiconductor processing method of claim 13, further comprising:

providing a boron-containing precursor to the processing region of the semiconductor processing chamber with the tungsten-containing precursor and the carbon-containing precursor.

17. The semiconductor processing method of claim 13, wherein the layer of material is characterized by a stress of greater than or equal to 250 MPa.

18. A semiconductor processing method comprising:

providing a tungsten-containing precursor and a carbon-containing precursor to a processing region of a semiconductor processing chamber, wherein a substrate is disposed within the processing region of the semiconductor processing chamber;

forming a plasma of the tungsten-containing precursor and the carbon-containing precursor in the processing region, wherein the plasma is at least partially formed by an RF power operating at a pulsing frequency less than or equal to 10,000 Hz, and at a duty cycle between 10% and 90%; and forming a layer of material on the substrate, wherein the layer of material comprises a tungsten-containing material, wherein the layer of material is characterized by a tungsten content of greater than or equal to 30 at. %, wherein the layer of material is characterized by an average surface roughness (Ra) of less than or equal to 0.7 nm, and wherein the layer of material is characterized by an extinction coefficient of greater than or equal to 2.5 at 633 nm.

19. The semiconductor processing method of claim 18, wherein the plasma is at least partially formed by an RF power operating at greater than or equal to 500 W and at a pulsing frequency greater than or equal to 1,000 Hz and less than or equal to 8,000 Hz.

20. The semiconductor processing method of claim 18, further comprising:

providing a boron-containing precursor to the processing region of the semiconductor processing chamber with the tungsten-containing precursor and the carbon-containing precursor.

* * * * *